United States Patent [19]

Weisfield et al.

[11] Patent Number: 5,119,183
[45] Date of Patent: Jun. 2, 1992

[54] COLOR SCAN ARRAY WITH ADDRESSING CIRCUITRY

[75] Inventors: Richard L. Weisfield, Menlo Park; Leonard E. Fennell, Half Moon Bay; William D. Turner, San Marino, all of Calif.

[73] Assignee: Xerox Corporation, Stamford, Conn.

[21] Appl. No.: 742,964

[22] Filed: Aug. 9, 1991

[51] Int. Cl.[5] .................. H04N 1/46; H04N 1/028
[52] U.S. Cl. ................................ 358/75; 358/482
[58] Field of Search .............. 358/75, 41, 213.29, 358/213.23, 213.26, 482, 483

[56] References Cited

U.S. PATENT DOCUMENTS

| | | | |
|---|---|---|---|
| 4,375,649 | 3/1983 | Mir et al. | 358/75 |
| 4,691,243 | 9/1987 | Cannella et al. | 358/482 |
| 4,691,244 | 9/1987 | Cannella et al. | 358/482 |
| 4,692,779 | 9/1987 | Ando et al. | 346/153 |
| 4,712,874 | 12/1987 | Sekimura et al. | 359/68 |
| 4,763,189 | 8/1988 | Komatsu et al. | 358/75 |
| 4,792,859 | 12/1988 | Wicker et al. | 358/473 |
| 4,796,072 | 1/1989 | Higashi et al. | 357/30 |
| 4,799,057 | 1/1989 | Takeda et al. | 340/811 |
| 4,825,203 | 4/1989 | Takeda et al. | 340/784 |
| 4,845,482 | 7/1989 | Howard et al. | 340/718 |
| 4,855,724 | 8/1989 | Yang | 340/703 |
| 4,896,216 | 1/1990 | Brunst et al. | 358/213.29 |
| 4,899,224 | 2/1990 | Ooba et al. | 358/332 |
| 4,931,787 | 6/1990 | Shannon | 340/784 |
| 4,953,953 | 9/1990 | Ferguson | 359/68 |
| 4,965,565 | 10/1990 | Noguchi | 340/784 |
| 4,972,255 | 11/1990 | Suzuki | 358/75 |
| 4,982,275 | 1/1991 | Brody | 358/59 |
| 4,994,877 | 2/1991 | Ino et al. | 357/30 |
| 4,994,907 | 2/1991 | Allen | 358/75 |
| 5,008,218 | 4/1991 | Kawachi et al. | 437/201 |
| 5,012,274 | 4/1991 | Dolgoff | 340/702 |
| 5,021,774 | 6/1991 | Ohwada et al. | 340/811 |
| 5,037,201 | 8/1991 | Smith, III | 358/75 |
| 5,050,990 | 9/1991 | Smith, III | 358/75 |

FOREIGN PATENT DOCUMENTS 63-136565 8/1988 Japan.

OTHER PUBLICATIONS

G. Brunst et al., MAT. RES. SOC. SYMP. PROC., vol. 118, p. 249 (1988).
H. Ito et al., MAT. RES. SOC. SYMP. PROC., vol. 95, p. 437 (1987).

Primary Examiner—Howard W. Britton
Attorney, Agent, or Firm—Rosen, Dainow & Jacobs

[57] ABSTRACT

A color scan array for linear imaging employing a matrix of photo-sensor and thin-film transistor (TFT) elements aligned in parallel rows with each row representing the same color and sub-pixels of a linear array of pixels. The rows of sub-pixels are sub-divided into groups, with the TFT of each color group commonly connected to a data line, and with plural gate lines provided each connected to the corresponding TFTs of the sub-pixels of each group pixel. The result is a short, compact sensor with a relatively small number of crossings and thus reduced capacitance and increased responsivity.

9 Claims, 3 Drawing Sheets

COLOR SCAN ARRAY WITH ADDRESSING CIRCUITRY

This invention relates to a color scan array, and in particular to a novel arrangement of sensor elements to improve addressing of the array elements.

BACKGROUND OF THE INVENTION

Thin-film transistor-driven linear image sensors are well-known. Reference is made to the following publications for descriptions of particular architectures and addressing circuitry and methods of fabrication: G. Brunst, et. al., MAT. RES. SOC. SYMP. PROC., Vol. 118, pg. 249 (1988); H. Ito, et. al., MAT. RES. SOC. SYMP. PROC., Vol. 95, pg. 437 (1987). These papers, whose contents are incorporated by reference, describe devices containing, for example, 300 dots per inch sensors and in linear form extending over, say, a standard page size of 8½ inches resulting in a large number of individual pixel elements, in particular, about 2500 in a black and white system. If it is desired to increase the sensor density to 400 per inch and cover the long dimension of a standard 8½×11 inch page, then the total increases to about 4800 pixels. To expand the system to include color, implying in a 3-color system a primary color of one red, one green and one blue sub-pixel jointly representing one pixel element, then the array size increases to nearly 15,000 individual sub-pixel sensor elements.

In a typical system that uses photodiodes as the sensors, readout is accomplished by transferring the photocharge from the photodiodes to a capacitor on which a voltage is developed which is proportional to the signal charge. The problem then arises as to how to address for readout these large numbers of elements in the simplest possible way with a minimum of interconnect lines. Moreover, in a color system, where the incident light is filtered through a color filter, the reduced light level incident on the sensor implies a need for increased responsivity of the sensors, where responsivity is the measured voltage per unit exposure. For the typical voltage sensing photodiode element, increased responsivity can be obtained without increasing size by reducing the capacitance which is used to develop the sense voltage. This capacitance is often the data line capacitances, and a low value is best achieved with reduced line lengths, and fewer crossovers.

These goals cannot be met using conventional matrix addressed array architectures. The most common approach of multiplexing data lines in a data line crossover matrix has several problems. The first problem is the large number of data lines required in order to handle the high data rate needed for color scanning. This leads to excessive array size and unacceptably high crosstalk between the data lines. A modification of this structure using ground shields between each data line crosspoint minimizes crosstalk but at the expense of extremely high data line capacitance and therefore low responsivity.

Another architecture commonly employed in such matrix-addressed scan arrays is a meander architecture where data lines pass back and forth between the photodiodes to avoid any crossing of the data lines. The problem with this approach for color arrays is that the lines must be extremely narrow to pass between the sensors and they must cover larger distances, adversely impacting yield and rendering the data line capacitances too large to achieve high responsivity.

SUMMARY OF INVENTION

An object of the invention is a color-scan array with an architecture of the matrix-addressed type exhibiting higher sensor responsivity.

Another object of the invention is a matrix-addressed scan array for color exhibiting reduced data-line capacitance.

A still further object of the invention is a matrix-addressed sensor color scan array of relatively small array size, capable of being manufactured with a reasonable yield, and exhibiting reduced crosstalk between signal lines.

According to one aspect of the invention, a linear array comprises a linear arrangement of pixels extending in the length direction of the array. Each of the pixels is subdivided into filtered sub-pixels representing a color component of a plurality of sub-pixels which in combination are sufficient to produce a color output signal. In a preferred arrangement, the number of sub-pixels chosen is equal to three, represented by the primary colors red, green and blue. The sub-pixels of each pixel are arranged close to one another, preferably one above the other. Hence, if the pixels are described as arranged in a pixel row extending parallel to the length direction of the sensor, then the pixel row is divided up into three separate sub-pixel rows, and the sub-pixels of each pixel can be described as being arranged in parallel columns. All of the sub-pixels in each sub-pixel row are provided with the same color filter. Thus, the top pixel row would all be associated with, say, a red filter, the middle sub-pixel row with, say, the green filter, and the bottom sub-pixel row with a blue filter.

In accordance with another aspect of the invention, each of the sensors has associated with it a transistor of the MOS type, preferably of the thin-film transistor type (TFT). Each transistor has a main electrode, source or drain, connected to a photodiode element lying under the filter, and its other main electrode, drain or source, connected to a signal readout or data-line. A plurality of main electrodes of adjacent TFTs are connected in parallel to the same data line. The TFTs and associated photodiodes of those interconnected TFTs constitute a group of sensors which can be connected via one of m data lines to the same input of a readout device, which is commonly in the form of a single chip. The present state of the art therefore would require in this architecture one readout chip per one or more groups of interconnected TFTs dependent on the number of input pins of the readout chip.

Each of the TFT devices contains a gate electrode, and in accordance with another aspect of this invention, n gatelines are provided which form a bus thus passing across the entire array, with connections passing to individual columns of the transistors. In a preferred arrangement, the signals carried by each transistor pass into the aforementioned common data lines, with n transistors per data-line. The data lines thus connected to the TFT electrodes can cross directly from the transistor or sensor region across the gate bus to the edge of the array where the groups of data lines can be connected to the individual readout chips.

In the above-described architecture of the invention, because the data lines are short and cross very few lines, the data line capacitances can be made very small. Hence, the sensors exhibit high responsivity. The short length of the data lines, together with the small number of data lines, keeps the overall height of the array short.

This increases yield and reduces cost. In addition, because the data lines rarely cross each other on the array, there is very little coupling between them and hence the crosstalk among the signal lines can be kept very low.

In view of the compactness of the array and the reduced capacitances, it becomes possible to employ smaller active TFT transistors and smaller photodiodes. This allows the TFTs to be oriented transverse to the usual orientation they possess in these devices; in this preferred embodiment, they are oriented with the long direction of the TFT parallel to the rows. This further contributes to the small size of the array, and the closer packing of the elements, and in turn further tends to reduce capacitances in the system.

The present invention will be better understood from the detailed description given herein below in conjunction with the accompanying drawings, which give by way of illustration only and not by limitation, a preferred embodiment in accordance with the present invention.

DETAILED DESCRIPTION OF PREFERRED EMBODIMENT

Figure 1:
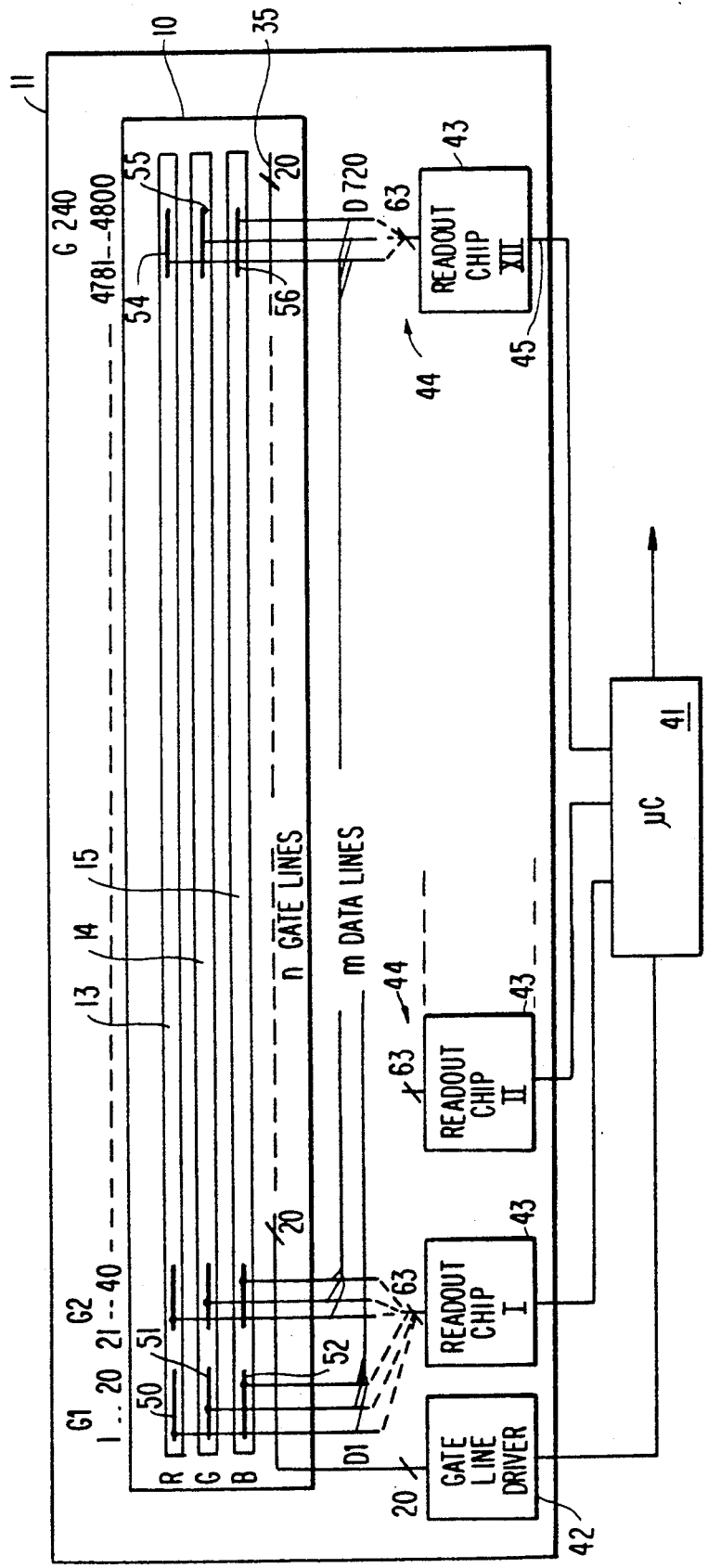
FIG. 1 is a schematic view of one form of color-scan array in accordance with the invention.

FIG. 1 schematically illustrates a preferred color-scan array in accordance with the invention. It comprises a linear sensor array 10 mounted on a suitable insulating carrier 11. The sensor 10 comprises an arrangement of imaging pixels 24 (FIG. 2) extending in the length direction of the sensor 10, which is the horizontal dimension in FIG. 1. Each pixel is made up of s filtered sub-pixels 25–27 (FIG. 2), each representing one color which when combined with the other sub-pixels will generate the desired color signal The sub-pixels associated with the same color are arranged in a row, parallel to the rows of the other sub-pixels and the length direction of the sensor 10. Thus, in FIG. 1, assuming that s=3 and the primary colors used are red (R), green (G), and blue (B), then all the red-filtered sub-pixels 25 form a row 13, all the green-filtered sub-pixels 26 form a row 14, and all the blue-filtered sub-pixels 27 form a row 15. The color order is not important.

Each sub-pixel 25–27 is composed of a photo-sensor 28 and a switch 29 used to address the photo-sensor. As is common in this art, the photo-sensor 28 is a photodiode, and the switch 27 is a thin film transistor (TFT), which together with the interconnections can be fabricated as is well-known by standard photo-lithography and related semiconductor processing steps. Any known process can be used, and any of the known materials for the photo-sensor and TFT. The present invention has to do mainly with the layout of pixel elements and their addressing connections.

Figure 2:
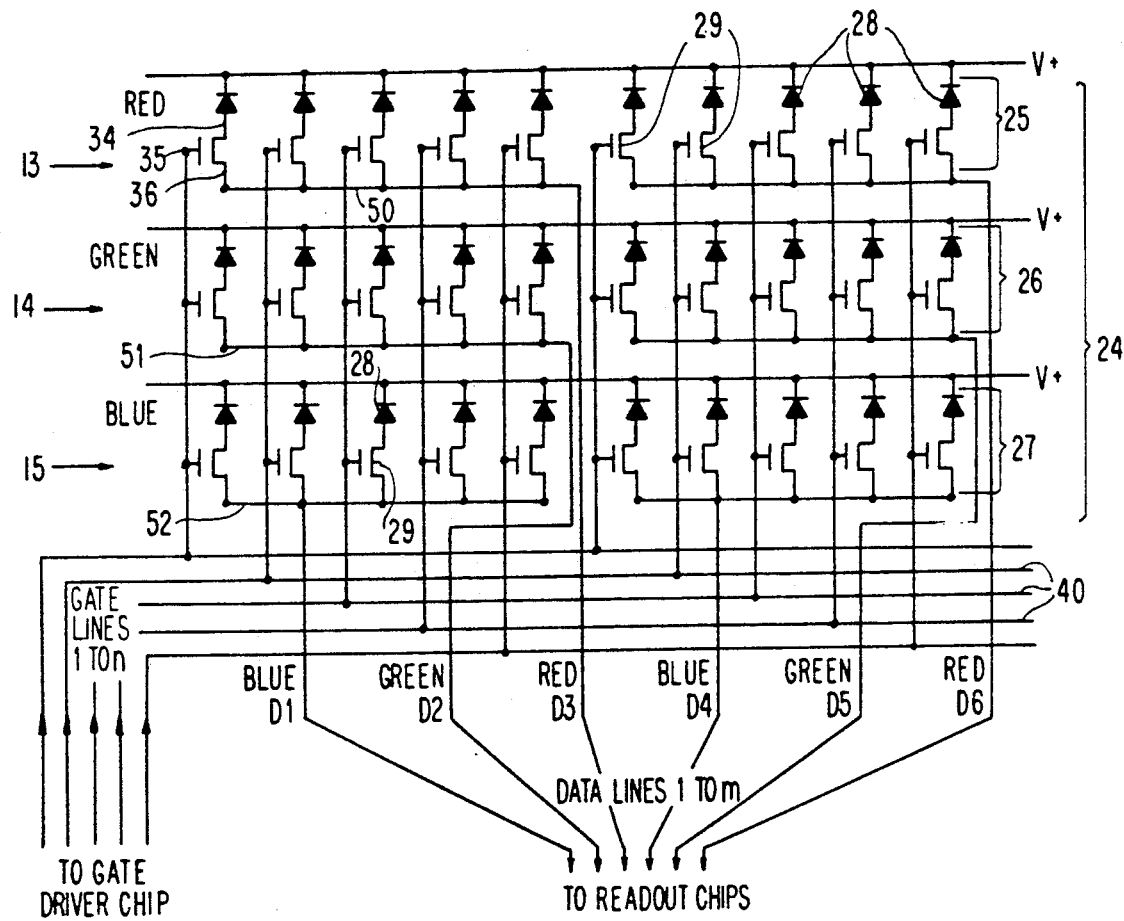
FIG. 2 is a schematic circuit diagram representing the layout of some of the electrical components of the color-scan array of FIG. 1.
Figure 3:
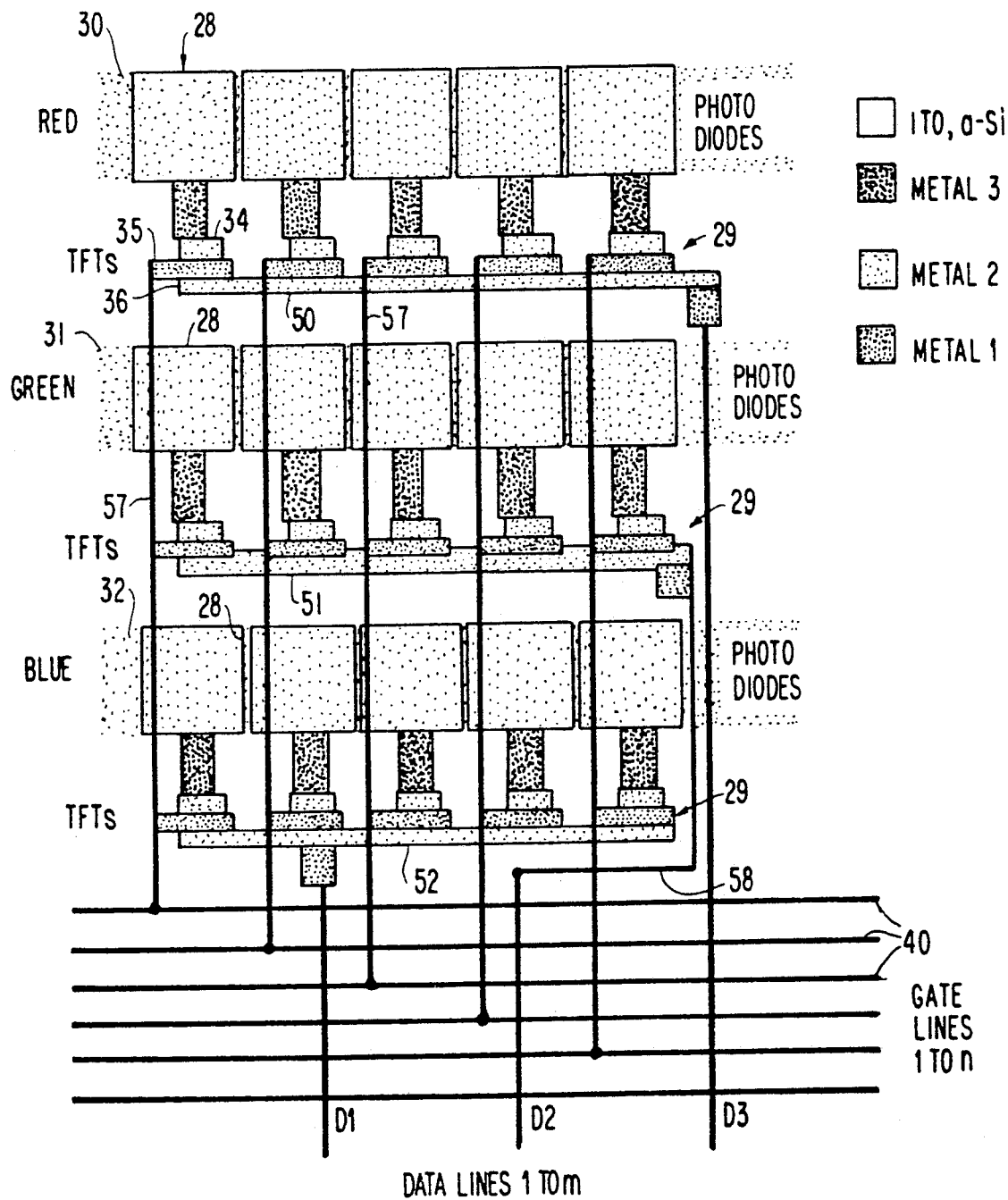
FIG. 3 is a plan view of a preferred layout of a part of the electrical components of the color-scan array of FIG. 1.

FIG. 2 shows a schematic and FIG. 3 the physical layout of a preferred arrangement of the sensor elements. The photodiodes 28 in a row are covered by a common filter; Thus, the R row 13 by a red filter 30, the G row 14 by a green filter 31, and B row 15 by a blue filter 32. Each photodiode 28 is in series with a TFT 29 between a power line V+ and one of m data lines D1..Dm. Each TFT 29 has source 34 and drain 35 main electrodes, and a gate electrode 36, with the main electrodes 34, 35 in the series path with the data lines. Each individual photodiode can be addressed by choosing one of the m data lines and one of n gate lines 40. A data line when asserted completes the circuit connection through a load (not shown) of the associated photodiode, and a gate line when asserted turns ON the associated TFT switch. Thus, as is well-known, the charge that accumulated in the selected photodiode 28 in response to the incident light during the preceding time interval is discharged through the load generating a signal representative of the filtered light incident on that photodiode during the preceding time interval. The resultant red, green and blue signals can be processed in the well known manner to display a color image of the object being scanned, or to print-out a color image. The addressing is done by the usual microprocessor or microcontroller 41 via a gate line multiplexing driver 42 and read-out circuitry conventionally provided in the form of multiplexing chips 43 having multiple inputs 44 and one output 45. The gate driver and read-out chips can be mounted directly on the carrier 11 below the sensor, so that all of the lines shown can be formed as deposits between the array elements and the chips, and between the latter and a connector (not shown) on the carrier connected to the μC. Alternatively, the μC 41 can also be mounted on the carrier 11.

A specific example, which is not to be considered limiting, will help explain the invention. Assume 4800 pixels, with s=3 sub-pixels per pixel. The sub-pixels of the same color are arranged in one of s/3 parallel rows, and are divided up into m/3 groups of n pixels per group. Thus, if n=20, there are 4800/20=240 groups, G1..G240. There are also n=20 gate lines 40.

Each gate line (1..n) is connected in common to the gates of all the sub-pixel switches in each pixel (3 gates in this instance), and each corresponding set of group gates is connected to the same gate line. Thus, the three gates of pixels 1, 21, 41...4781 are all connected to gate line 1, the three gates of pixels 2, 22, 42 . . . 4782 are all connected to gate line 2, and so on until the three gates of pixels 20, 40, 60 . . . 4800 are connected to gate line n. Thus, each gate line is connected to 720 transistors.

There are also m=720 data lines. Each data line is connected in common to one of the main electrodes of all the TFTs in a color group. Thus (see FIGS. 1 and 2), data line D1 is connected via common line 52 to the main electrodes 36 of all the TFTs in the blue row of group G1, data line D2 via common line 51 to the main electrodes 36 of all the TFTs in the green row of group G1, and data line D3 via common line 50 to the main electrodes 37 of all the TFTs in the red row of group G1. Data lines D4–D6 are connected in the corresponding manner to the group G2 pixels, and so on until data lines D718–D720 are connected via common lines 54–56 to the corresponding color sub-pixels of group G240. Thus, with s=3, and m=720, there are 720/3=240 groups.

FIG. 3 shows the preferred layout, with the different shading illustrating the metal or other conductive layers used in the photo-lithographic process. The square is the photodiode area, typically of amorphous silicon. The gates 35 are laid down first in a self-aligning process, followed by the source and drain metallizations (insulating layers are not shown) and the common source interconnects 50-52. The interconnects between each photodiode and the drain of its associated TFT next follows.

This can be done simultaneously with the depositing of the bus constituting the parallel gate lines 40 and the interconnects 57 of each set of sub-pixel gates to one of the n gate lines of the gate bus. The interconnects 57 can be run straight down alongside and between the TFTs directly to their respective gate line (not shown in FIG. 1). The common lines representing the voltage source V+ are not shown in FIG. 3. The group source interconnects 50-52 becoming the data lines perferably run straight down to cross the gate bus only once. An occasional lateral extension, shown at 58 may be necessary to simplify the connections to the read-out chips.

For simplicity, it should be noted that FIG. 2 shows groups totaling five pixels each, instead of the correct number of twenty as illustrated in FIG. 1, and FIG. 3 shows a like number of group pixels. As mentioned, the specific numbers as such are not important to the invention.

As will be clear from FIG. 3, the sub-pixels can be laid out close to one another, resulting in a compact arrangement. Also, the TFT channel length is parallel to the columns. In other words, the short dimension L of the TFT is transverse to the array length dimension, and the long dimension W of the TFT is parallel to the array length dimension. This also contributes to closer packing of elements, a shorter array, and thus shorter line lengths.

The arrangement shown can be implemented With twelve 64×1 readout MUXs, with some unused inputs. Typically, corresponding data lines connected to the chips are read out or scanned sequentially, with the n gate lines being scanned sequentially during the interval that a data line is addressed. But the invention is not limited to this addressing mode.

It will be evident from the foregoing description that the invention results in a very narrow compact structure easily formed by standard photo-lithography and other technologies well known in the field. By laying out the set of sub-pixels for each pixel element in parallel columns, with the sub-pixels representing the same color component in the same row, parallel to the other sub-pixels rows, and by dividing up the pixels into many groups of a relatively small number n of pixels per group, thus requiring only n gate lines to address a corresponding set of sub-pixel elements in each group, only a small number of gate lines becomes necessary. These are conveniently located as a narrow bus adjacent the array of pixels. Thus, the data lines can be made short, because they cross only a narrow gate bus, and very few gate lines. Moreover, the data lines for the most part need never cross each other on the array. The result is small data line capacitances, high responsivity, little signal crosstalk, and an array whose overall height is short which translates into high fabrication yields and low-cost manufacture.

While the invention has been described and illustrated in connection with preferred embodiments, many variations and modifications as will be evident to those skilled in this art may be made therein without departing from the spirit of the invention, and the invention as set forth in the appended claims is thus not to be limited to the precise details of construction set forth above as such variations and modifications are intended to be included within the scope of the appended claims.

What is claimed is:

1. A matrix-driven color scan array comprising:
   (a) a linear arrangement of p imaging pixel elements extending along a given length direction,
   (b) each of said imaging pixel elements comprising a set of s sub-pixel elements each representing different color components,
   (c) each sub-pixel element comprising a photo-sensor element and a switch connected to the photo-sensor element and having at least first and second electrodes which must be selected to address the sub-pixel element,
   (d) said sub-pixel elements being arranged in s rows extending parallel to the given length direction,
   (e) the sub-pixel elements of each set constituting one pixel element being arranged in parallel columns,
   (f) means associated with the sub-pixels elements in each row for rendering them sensitive to the same color component,
   (g) said sub-pixels elements along a row being subdivided into m/s groups of n sub-pixel elements,
   (h) means for interconnecting the first electrodes of each group of sub-pixel elements in a row to form m data line connection points,
   (i) means for interconnecting the second electrodes of each column of sub-pixel elements,
   (j) m data lines,
   (k) means for connecting each of the data line connection points to one of the m data lines,
   (l) n drive lines,
   (m) means for connecting the second electrode interconnection means of each column of sub-pixel elements of each group of sub-pixel elements to one of the n drive lines, whereby activation of each drive line will prepare all sub-pixel elements in one set of each group for selection, and activation of each data line will prepare all sub-pixel elements in the same row and in the same group for selection.

2. A matrix-driven color scan array as claimed in claim 1, wherein the n drive lines form a bus extending parallel to the given length direction.

3. A matrix-driven color scan array as claimed in claim 2, wherein the n drive lines extend adjacent the rows of sub-pixel elements.

4. A matrix-driven color scan array as claimed in claim 3, wherein the m drive lines extend directly from the data line connection points across the drive line bus to the edge of the array.

5. A matrix-driven color scan array as claimed in claim 4, wherein s=3, p equals about 4800, n equals about 20, and m equals about 720.

6. A matrix-driven color scan array as claimed in claim 4, wherein m is in the range of hundreds, and n is in the range of tens.

7. A matrix-driven color scan array as claimed in claim 6, wherein the photo-sensors comprise photodiodes, the switches comprise TFTs having first, second and third electrodes, the first and third electrodes being main electrodes, the second electrode being a gate electrode.

8. A matrix-driven color scan array as claimed in claim 7, wherein the TFTs are oriented with their long width dimension extending parallel to the array's length dimension.

9. A matrix-driven color scan array as claimed in claim 7, further comprising a carrier for the array, means on the carrier for generating selection signals for and connected to the drive lines, means on the carrier for reading data signals and connected to the data lines.

* * * * *